United States Patent [19]
Haraguchi et al.

[11] Patent Number: 5,332,910
[45] Date of Patent: Jul. 26, 1994

[54] SEMICONDUCTOR OPTICAL DEVICE WITH NANOWHISKERS

[75] Inventors: Keiichi Haraguchi, Kokubunji; Kenji Hiruma, Tokorozawa; Kensuke Ogawa, Hachioji; Toshio Katsuyama, Ome; Ken Yamaguchi, Fuchu; Toshiyuki Usagawa, Yono; Masamits Yazawa, Yokohama; Toshiaki Masuhara, Hinode, all of Japan; Gerard P. Morgan, Co. Gaiway, Northern Ireland; Hiroshi Kakibayashi, Nagareyama, Japan

[73] Assignee: Hitachi, Ltd., Tokyo, Japan

[21] Appl. No.: 159,343

[22] Filed: Nov. 30, 1993

Related U.S. Application Data

[63] Continuation of Ser. No. 856,135, Mar. 23, 1992, abandoned, which is a continuation-in-part of Ser. No. 686,780, Apr. 17, 1991.

[30] Foreign Application Priority Data

Mar. 22, 1991 [JP] Japan .................... 3-058570

[51] Int. Cl.⁵ ............................. H01L 33/00
[52] U.S. Cl. ......................... 257/13; 257/17; 257/21; 257/22; 257/95; 257/465; 257/466; 372/48; 372/45
[58] Field of Search .............. 257/14, 17, 22, 21, 257/13, 88, 90, 95, 89, 443, 465, 466, 618, 623, 81, 82, 93, 91; 372/48, 45, 46

[56] References Cited

U.S. PATENT DOCUMENTS

| | | | |
|---|---|---|---|
| 3,457,633 | 7/1969 | Marinace et al. | 257/88 X |
| 3,536,830 | 10/1970 | Hakki | 257/88 X |
| 3,925,803 | 12/1975 | Kobayashi | 357/22 |
| 4,155,781 | 5/1979 | Diepers | 148/175 |
| 5,054,030 | 10/1991 | Sakaki | 372/45 |
| 5,073,893 | 12/1991 | Kondou | 372/45 |
| 5,075,742 | 12/1991 | Gerard et al. | 372/45 X |
| 5,079,186 | 1/1992 | Narusawa | 437/133 |
| 5,170,405 | 12/1992 | Connolly et al. | 372/45 X |

FOREIGN PATENT DOCUMENTS

| | | | |
|---|---|---|---|
| 0452950 | 10/1991 | European Pat. Off. | |
| 60-250684 | 12/1985 | Japan | 372/46 |
| 0498888 | 3/1992 | Japan | 372/46 |

OTHER PUBLICATIONS

Fressura et al., "Large High-Density Monolithic XY-Addressable Arrays for Flat-Panel LED Displays," IEEE Transactions on Electron Devices, vol. Ed-24, No. 7, Jul. 1977, pp. 891-898.

Yazawa et al., "Heteroepitaxial Ultrafine Wire-Like Growth of InAs on GaAs Substrates," *Appl. Phys. Lett.* 58(10), Mar. 11, 1991, pp. 1080-1082.

Morkoc et al., "Whisker Growth during Epitaxy of GaAs by Molecular Beam Epitaxy," *Japanese Jour. of Appl. Phys.*, vol. 21, No. 4, Apr. 1982, pp. L230-L232.

Kasahara et al., "GaAs Whiskers Grown by a Thermal Decomposition Method," *Journal of Crystal Growth*, 38(1977), pp. 23-28.

Givargizov, "Oriented Growth of Whiskers of $A^{III}B^V$ Compounds by VLS-Mechanism," *Kristall und Technik*, vol. 10, No. 5, 1975, pp. 473-484.

(List continued on next page.)

*Primary Examiner*—William Mintel
*Attorney, Agent, or Firm*—Kenyon & Kenyon

[57] ABSTRACT

A semiconductor light-emitting device includes a plurality of semiconductor rods, each of which has a pn junction. The semiconductor rods are formed on a semiconductor substrate such that the plurality of semiconductor rods are arranged at a distance substantially equal to an integer multiple of the wavelength of light emitted from the semiconductor rod. With such devices, various novel optical devices such as a microcavity laser of which the threshold current is extremely small and a coherent light-emitting device having no threshold value can be realized.

24 Claims, 16 Drawing Sheets

OTHER PUBLICATIONS

Givargizov, "Growth of Whiskers by the Vapor–Liquid–Solid Mechanism", *Current Topics in Material Science*, vol. I, Ed. Kaldis, North-Holland, 1978, pp. 79–83, 102–103, 124–125, 138–145.

Jewell, J. L. et al., "Surface emitting microlasers for photonic switching and interchip connections", Optical Engineering, vol. 29, No. 3, Mar. 1990, pp. 210–214.

Patent Abstracts of Japan, vol. 14, No. 268 (E-093), English language abstract of JP-A-02 084 787, Jun. 11, 1990.

Patent Abstracts of Japan, vol. 14, No. 391 (E-968), English language abstract of JP-A-02 143 581, Aug. 23, 1990.

Patillon, J. N. et al., "Fabrication and Optical Characterization of InGaAs/InP Quantum Wires and Dots", Japanese Journal of Applied Physics, Extended Abstracts 22nd Conference on Solid State Devices and Materials, 1990, pp. 107–110.

Arakawa, Y. et al., "Quantum Wire and Box Lasers", Japanese Journal of Applied Physics, Extended Abstracts 22nd Conference on Solid State Devices and Materials, 1990, pp. 745–748.

SEMICONDUCTOR OPTICAL DEVICE WITH NANOWHISKERS

CROSS REFERENCE TO RELATED APPLICATION

This application is a continuation of application Ser. No. 07/856,135 filed on Mar. 23, 1992, now abandoned, which is a continuation-in-part of U.S. patent application Ser. No. 07/686,780, filed Apr. 17, 1991, the disclosure of which is incorporated herein by reference.

BACKGROUND OF THE INVENTION

The present invention relates to a semiconductor optical device and, more particularly, to a semiconductor optical device suitable for use as a light-emitting diode or a laser for coherent optical communications.

In order to improve directionality and wavelength selectivity of light in the light-emitting semiconductor device, i.e., the light-emitting diode and laser, a distributed feedback semiconductor laser has been proposed. There has also been proposed a so-called micro-cavity laser as a semiconductor laser provided in an extremely small structure. For example, in a micro-cavity laser having a structure comparable to a wavelength, as described in Extended abstracts (the 43rd Autumn Meeting (1982)), the Japan Society of Applied Physics, and related Society, 29a-B-6, p. 127, all of the light waves are regulated by eigen (resonant) modes of extremely small number (several or zero), not only induced transition but also spontaneous emission process is extremely limited, and therefore, it becomes possible to realize novel optical devices such as coherent light-emitting devices or coherent LEDs with no threshold value and lasers with a very low threshold value.

However, since the above distributed feedback semiconductor laser requires that a grating is formed on the semiconductor substrate, crystalline defects are liable to be produced at the time of crystal growth. There have therefore been such drawbacks with it that a semiconductor laser of high quality is difficult to obtain. Further, since the micro-cavity laser requires a very high level of techniques in its fabrication, it has been very difficult to actually produce lasers having uniform characteristics with good reproducibility.

An object of the present invention is to eliminate the drawbacks in the above described distributed feedback semiconductor laser and to provide a semiconductor optical device with high directionality and wavelength selectivity of light.

Another object of the present invention is to provide a micro-cavity laser which can be manufactured easily and with good reproducibility.

SUMMARY OF THE INVENTION

In the present invention, in order to improve directionality and wavelength selectivity of light, there are formed nanowhiskers having a pn junction on the surface of a semiconductor substrate 3 as shown in FIG. 1. The nanowhisker is formed of an n-type region 1 and a p-type region 2 and a plurality of the same are arranged at intervals of an integer multiple of the wavelength as shown in FIG. 1. Accordingly, emitted light from the pn junction of each of the nanowhiskers superimpose on each other and, as a result, the so-called laser beam which is excellent in directionality and wave selectivity of light is emitted sideways. At this time, since nanowhiskers in which defects are hardly produced are used in the present invention, a great advantage is obtained that a laser of higher quality than the conventional distributed feedback semiconductor lasers can be provided.

In the above, the case where a plurality of nanowhiskers are arranged one-dimensionally, i.e., linearly, was described. If a plurality of nanowhiskers are arranged on a plane at intervals of an integer multiple of the wavelength in each of two directions crossing each other at a right angle, high quality laser beams can be obtained from two directions crossing at a right angle, independently. This is a new function which has never been obtained from conventional distributed feedback semiconductor lasers. By arranging nanowhiskers at intervals of an integer multiple of the wavelength in desired two directions other than those orthogonal to each other, laser beams emitted in such desired directions can be obtained and the use of the device can be remarkably expanded. On the other hand, if the interval between nanowhiskers in a desired direction is set to be different from an integer multiple of the wavelength, light is not emitted in that direction. The interval L most effectively preventing light from being emitted in that direction is $L=(2N+1)\lambda/2$, where $\lambda$ represents the wavelength of the light and N represents an integer. Of course, the wavelength $\lambda$ is compensated for the refractive index of the dielectric through which the light propagates.

The micro-cavity laser of the present invention is formed of a semiconductor rod smaller than 1 μm in diameter and the electrical property of the semiconductor rod changes from n-type to p-type in the middle of the rod. Its structure is shown in FIG. 22, in which an example if a semiconductor rod formed of p-GaAs and n-GaAs. With the micro-cavity laser structured in the described manner, since the refractive index inside the rod as a resonator becomes higher than that outside the rod and the size is very small, only an extremely small number of eigen modes are allowed to exist and the so-called low-threshold value laser can be realized.

Further, by selecting the direction of the length of the rod to be in the direction of the crystal axis (111) of the direct transition semiconductor crystal, good symmetry of the crystal is obtained and a more effective laser can be lased.

If the semiconductor rod 201 is buried in the core 202 of an optical fiber 203 for optical communication as shown in FIG. 23, light is effectively introduced into the optical fiber 203 and a much greater merit than before can be obtained from the optical fiber as a medium for optical transmission.

A method to realize such a semiconductor rod is to use a very thin semiconductor crystal epitaxially grown on a semiconductor substrate. More specifically, as shown in FIG. 24, a very thin semiconductor crystal 205 of GaAs, for example, is formed by epitaxial growth from the substrate 204 and, in the course of the epitaxial growth, the species of the ion for doping is changed, for example from n-type to p-type, and thereby the micro-cavity laser can be produced.

Further, instead of the very thin nanowhisker whose diameter monotonously changes, a thin crystal whose diameter periodically changes along the length in the course of growth may be used, with the period of the changing diameter set to be equal to one half the wavelength, and then, a distributed feedback amplification type semiconductor laser can be obtained.

In the present invention, as shown in FIG. 1, the distance from one light-emitting rod to the adjoining light-emitting rod is an integer multiple of the wavelength λ of the emitted laser beam. Through such arrangement, a beam with the wavelength λ outgoing from a light-emitting rod induces excitons within another light-emitting rod and thus a beam with the wavelength λ being in phase can be lased. At this time, from the spatial mean value $n_2$ of the refractive index $n_0$ of the surroundings of the light-emitting rod and the refractive index $n_1$ of the light-emitting rod and λ, obtained using the thickness W of the light-emitting rod, the distance was set to an integer multiple of $\lambda' = \lambda/n_2$.

If a plurality of light-emitting rods 9 are arranged in a regular n-polygon configuration as shown in FIG. 15, then light beams are radiated in the directions of all the sides from the respective light-emitting rods. If an optical device of the configuration in which a plurality of light-emitting rods are arranged as described above is used as an optical antenna, it becomes possible to capture electromagnetic waves propagating from all directions in the two-dimensional space.

When two optical devices 11 are arranged as shown in FIG. 18a and one is supplied with power so as to operate as a laser oscillator throwing its laser beam to the other, the other device operates as a receiver. By using two or more of such optical devices, transmission and reception of signals between the optical devices as shown in FIG. 18b can be realized. Further, if each of the optical devices is provided with a feedback system and adapted to once convert an electromagnetic wave propagated from the surroundings into electricity and then convert the electricity into a light beam through its own optical device to irradiate another optical device with the light beam, the devices will freely communicate with each other and such an arrangement will be applicable to a neural network.

Further, since the micro-cavity laser according to the present invention is very small in size being of the order of a wavelength, a laser having a low threshold value or a coherent light-emitting device or a coherent LED having no threshold value can be obtained.

In the case for example of the micro-cavity laser shown in FIG. 22, since the radius is as small as less than 1 μm and the length is comparable to the wavelength of the light, all of the light waves have an extremely small number of eigen resonant modes. Accordingly, not only induced transition but also spontaneous emission processes are strictly controlled and hence a coherent light-emitting device or a coherent LED having no threshold value or a laser having a low threshold value can be formed. Besides, since the electrical property is changed from n-type to p-type in the middle of the rod, light emission by injection of carriers occurs by the pn junction effect and, hence, lasing takes place.

When the rod 201 is buried in an optical fiber 203 as shown in FIG. 23, the light beam emitted from the end face of the rod 201 is effectively confined in the optical fiber 202 and transmitted therethrough. Therefore, the coupling efficiency between the light source and the optical fiber is greatly improved over that in the conventional arrangements.

DETAILED DESCRIPTION OF THE PREFERRED EMBODIMENTS

Embodiment 1

Figure 2A:
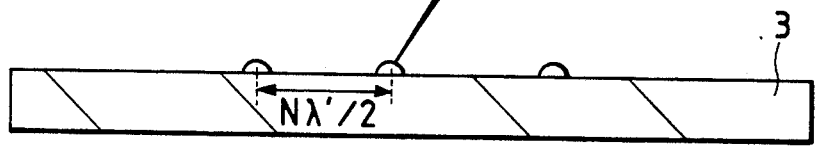
FIGS. 2a to 2c are diagrams showing a method for manufacturing a light-emitting device of the present invention.

Nanowhiskers were selectively grown on the plane of GaAs (111) B substrate by low-pressure metal organic vapor phase epitaxy and, thereby, a light-emitting rod was produced. In order to grow the nanowhiskers at desired positions, focused ion beams (FIB) were thrown on specified positions of the GaAs (111) B substrate 3 doped with $10^{18}/cm^3$ of a donor as shown in FIG. 2a and, thereby, seeds from which GaAs nanowhiskers would grow were produced. More specifically, the semimetal forming eutectic with the semiconductor was implanted by FIB and the seeds from which crystals would grow were produced.

Figure 2B:
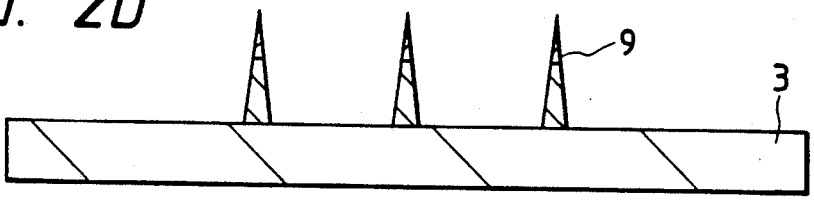

Then, nanowhiskers 9 were grown above the portions of the seeds as shown in FIG. 2b by low-pressure metal organic vapor phase epitaxy. Doping of the nanowhisker with impurities was performed such that, first, the nanowhisker was doped with an n-type impurity until it grew to a length of 2.1 $\mu$m and, then, the impurity was changed to a p-type impurity and therefrom the nanowhisker of p-type was allowed to grow another length of 2.1 $\mu$m. Accordingly, the nanowhisker is 4.2 $\mu$m long and has a pn junction formed just in its center. The doping concentration was set to $10^{18}/cm^3$ for both the donor and the acceptor.

Figure 2C:
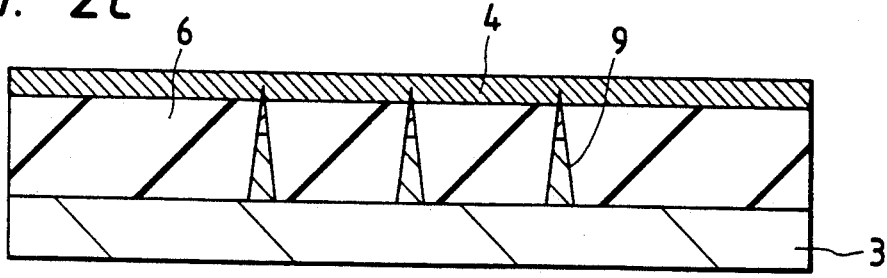

Spin-on-glass (SOG) was applied to the substrate with the nanowhiskers grown thereon as shown in FIG. 2c. After the application, the SOG was cured by being held in a temperature of 480° C. for 30 minutes and, thereby, an SOG film 6 being 4 $\mu$m thick was formed. The SOG stuck to the tip portion of the nanowhisker 9 was etched along a length of 0.2 $\mu$m by a hydrofluoric acid-system etchant and, thereby, the surface of the tip portion was exposed. A p-electrode 4 of a gold-zinc alloy film was formed above the tip portions by evaporation deposition and an ohmic contact was formed thereon by annealing the substrate under a temperature of 450° C.

Figure 1:
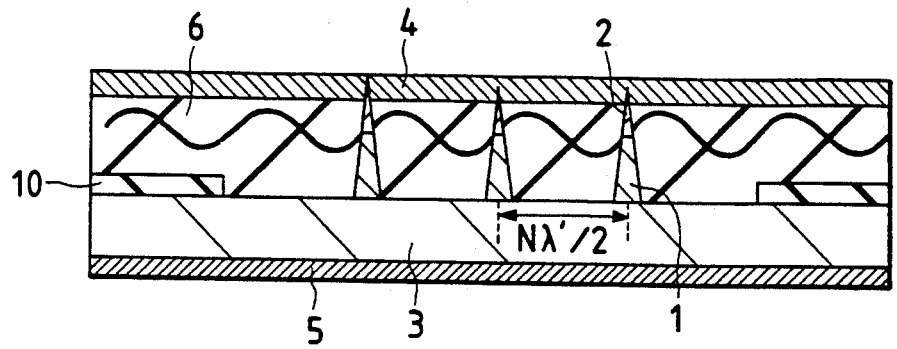
FIG. 1 is a diagram explanatory of a light-emitting device or an optical antenna formed with nanowhiskers having a pn junction.
Figure 3A:
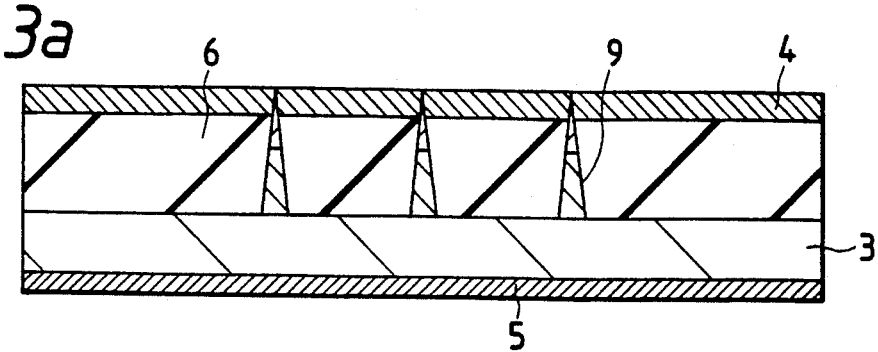
FIGS. 3a and 3b are diagrams showing a light-emitting device of the present invention and a method for manufacturing the same.
Figure 3B:
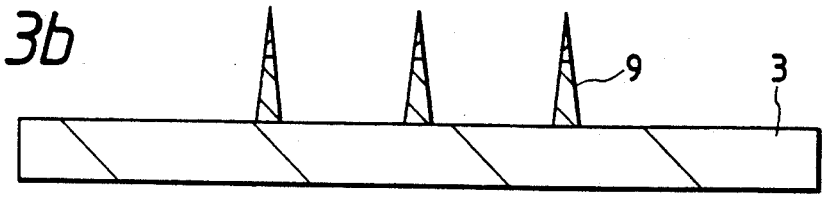
Figure 8A:
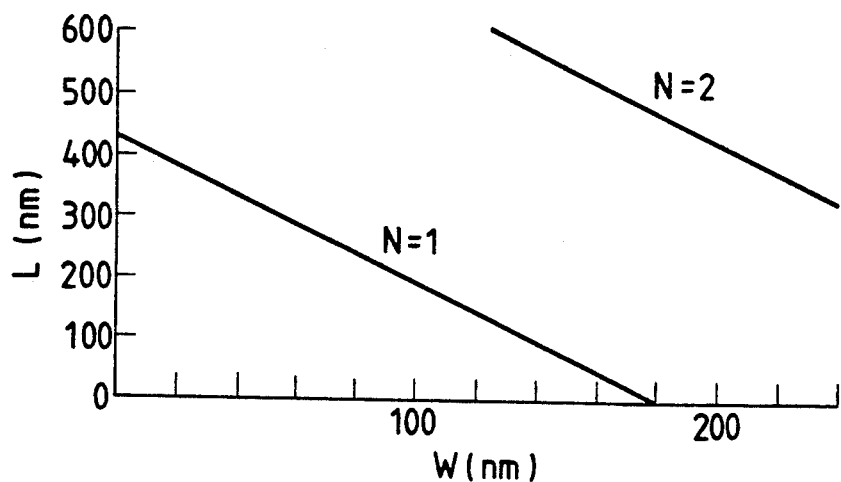
FIGS. 8a and 8b are graphs showing examples of light emitting characteristics of an optical device of the present invention.
Figure 8B:
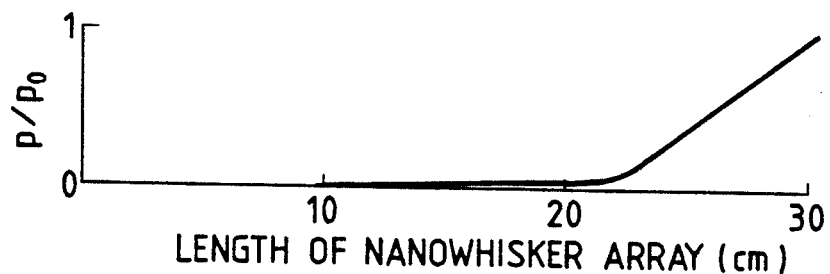

The rear side of the substrate 3 was polished by fine polishing powder as shown in FIG. 3a, whereby total thickness was made to 100 $\mu$m. A gold-germanium-nickel film was deposited by evaporation on the rear surface of the substrate 3 to form an n-electrode 5. The substrate was then annealed under a temperature of 450° C. and a laser oscillator as shown in FIG. 1 was produced. An electric field was applied to the laser oscillator and its characteristics were investigated. The laser oscillator shown in FIG. 1 was obtained by linearly arranging the nanowhiskers obtained as described above. It was investigated under what conditions the oscillator can lase. The relationship between the length of the substrate with the nanowhiskers one-dimensionally arranged thereon and the intensity of the oscillated laser beam (normalized power) $P/P_0$ is shown in FIG. 8b. It was observed, as shown in FIG. 8b, that the intensity of the oscillated laser beam sharply increased when the substrate length W exceeded approximately 20 cm. Further, representing the distance between adjoining nanowhiskers by L and the average thickness of the nanowhisker by W, the relationship between L and W at the time when lasing occurred was obtained as shown in FIG. 8a.

In the present embodiment, completely the same results were obtained even if the positions of the p-type region and n-type region were reversed.

Embodiment 2

The optical device as shown in the embodiment 1 was produced not using FIB but through the following process.

Figure 4:
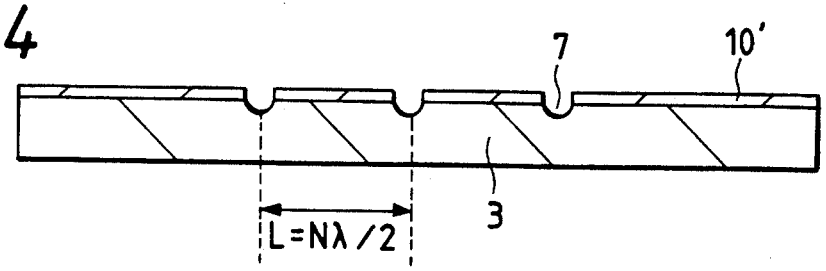
FIG. 4 is a diagram explanatory of formation of nanowhiskers.

First, as shown in FIG. 4, an $SiO_2$ film 10' was formed on a GaAs substrate 3 by a thermal CVD method to thickness of 0.1 $\mu$m. Then, holes 7 being 0.1 $\mu$m in diameter were made in the $SiO_2$ film 10' by photolithography and vapor phase etching. The distance L between adjoining holes 7 was set to an integer multiple of semi-wavelength ($\lambda/2$). Above the holes 7, n-doped GaAs nanowhiskers were grown by an MOCVD method. Thereafter, the p-electrode and n-electrode were formed in the same way as in the embodiment 1. The micro-cavity laser formed through this process exhibited similar characteristics to those of the laser in the embodiment 1.

Figure 6A:
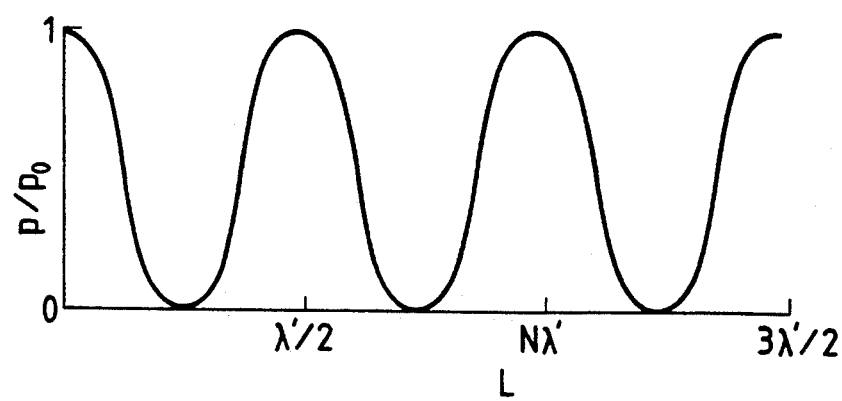
FIGS. 6a and 6b and FIG. 7 are graphs showing examples of light emitting characteristics of an optical device of the present invention.
Figure 6B:
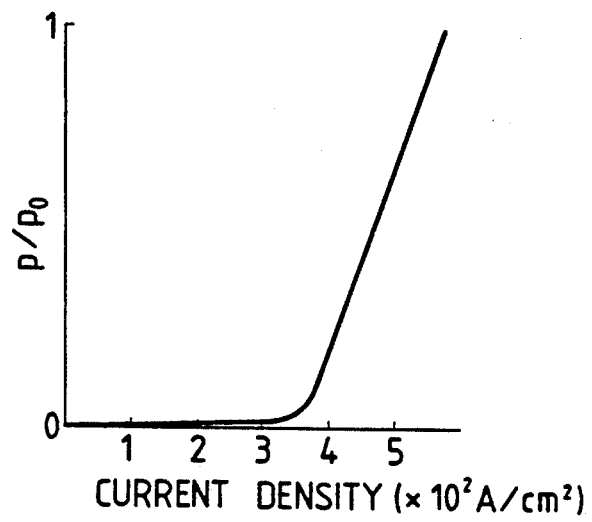
Figure 7:
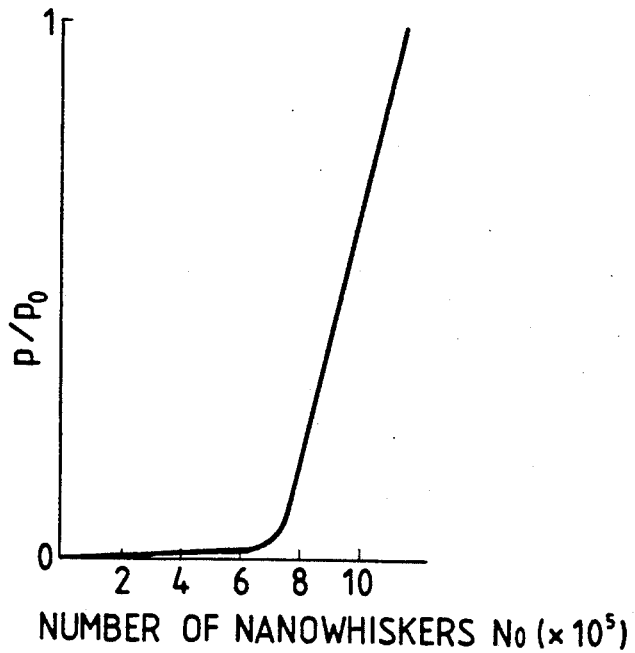

Setting the distance between the nanowhiskers L=172 nm, the thickness of the nanowhisker W=100 nm, the refractive index of the SOG $n_0=1$, the refractive index of the nanowhisker $n_1=3.61$, the spatial mean value of the refractive index $n_2=n_0+(n_1-n_0)\times(W/L)=2.52$, the number of the nanowhiskers $N_0=7.7\times10^5$, the wavelength of the emitted light from the nanowhisker $\lambda=865.4$ nm, and the oscillated laser wavelength $\lambda'=344$ nm, and denoting natural number by N, the relationship between the distance L and the intensity of the oscillated laser beam (normalized power) $P/P_0$ is shown in FIG. 6a, the relationship between the current density flowed through the nanowhisker and $P/P_0$ is shown in FIG. 6b, the relationship between $N_0$ and $P/P_0$ when W was set to W=100 nm is shown in FIG. 7; and the relationship between L and W at the time when laser beam was oscillated is shown in FIG. 8a.

Embodiment 3

Figure 10:
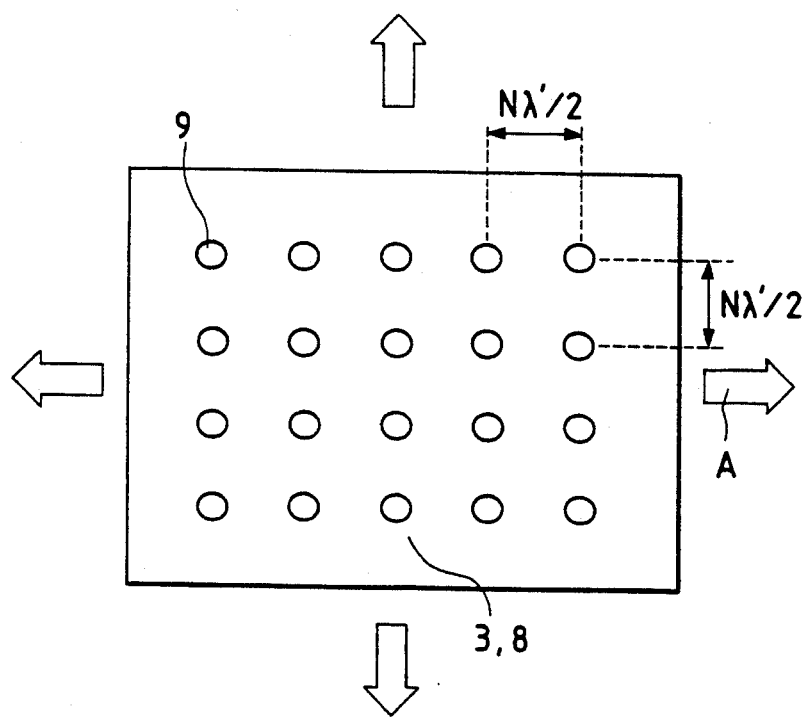
FIGS. 10, 11, and 12 are diagrams explanatory of optical devices emitting light in two directions.
Figure 11:
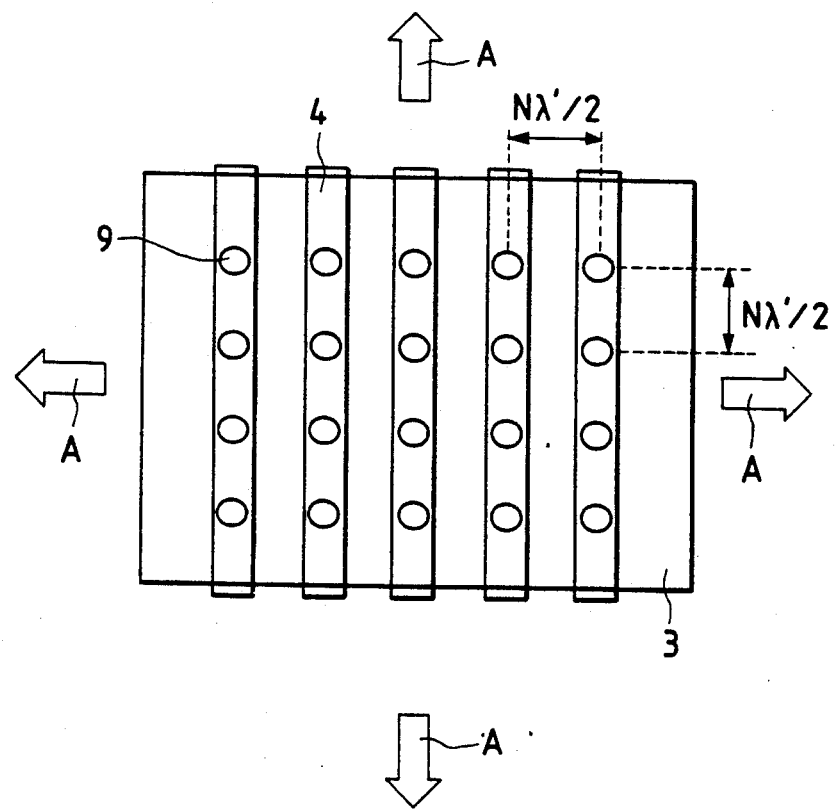

In the embodiments 1 and 2, a plurality of nanowhiskers 9 were arranged on the plane of the n-type GaAs (111) B substrate 3 so that the distance between adjoining nanowhiskers 9 would become an integer times as large as $\lambda/n_2$ as shown in FIG. 10 and SOG was applied onto the same. Then, p-electrodes 4 were formed by evaporation along the rows or columns as shown in FIG. 11. Thereby, it became possible to cause only desired one row or one column of the nanowhiskers 9 to emit light. Further, by applying power only to one row or one column, an extremely narrow laser beam, whose width is comparable to the wavelength of the laser beam, could be obtained. The oscillated laser beams were observed only in the directions indicated by the arrows A in FIG. 10 and not observed in other directions because of attenuation due to interference of light.

In the present embodiment, completely the same results were obtained even if the positions of the p-type region and n-type region were reversed.

Embodiment 4

Figure 5A:
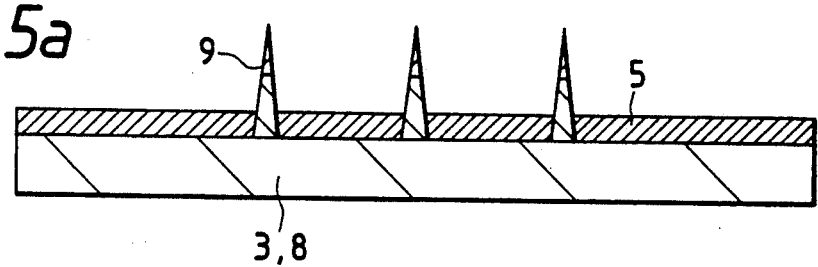
FIGS. 5a and 5b are diagrams explanatory of formation of an n-electrode.
Figure 5B:
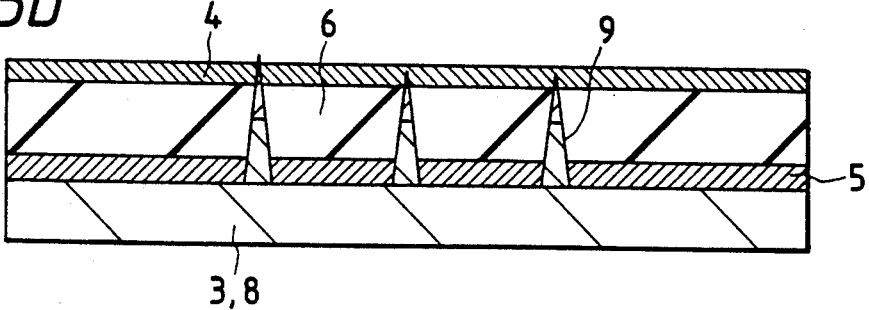

In the embodiments 1 and 2, a plurality of nanowhiskers 9 were arranged on the plane of a GaAs (111) B semi-insulating substrate 8 so that the distance between adjoining nanowhiskers 9 would become an integer times as large as $\lambda/n_2$ as shown in FIG. 10 and then, before SOG was applied onto the substrate 8 with the nanowhiskers 9 formed thereon, n-electrodes 5 were formed as shown in FIG. 5a. When gold, germanium, and nickel were evaporated for forming the n-electrodes 5, the quantity of the gold, germanium, and nickel sticking to the nanowhisker 9 was small because the direction of flying atoms during the evaporation deposition and the direction of the nanowhisker 9 are opposite to each other, and so they could be easily removed by etching. Then, SOG was applied and baked in the same way as in the embodiments 1 and 2, and p-electrodes were formed in the same way as in the embodiment 3. Thereby, it became possible to cause only desired one row or one column of the nanowhiskers to emit light. Further, by applying power only to one row or one column of the nanowhiskers, an extremely narrow laser beam, whose width is comparable to the wavelength of the laser beam, could be obtained. The oscillated laser beams were observed only in the directions indicated by the arrows A in FIG. 10 and not observed in other directions because of attenuation due to interference of light.

In the present embodiment, completely the same results were obtained even if the positions of the p-type region and n-type region were reversed.

Embodiment 5

Figure 12:
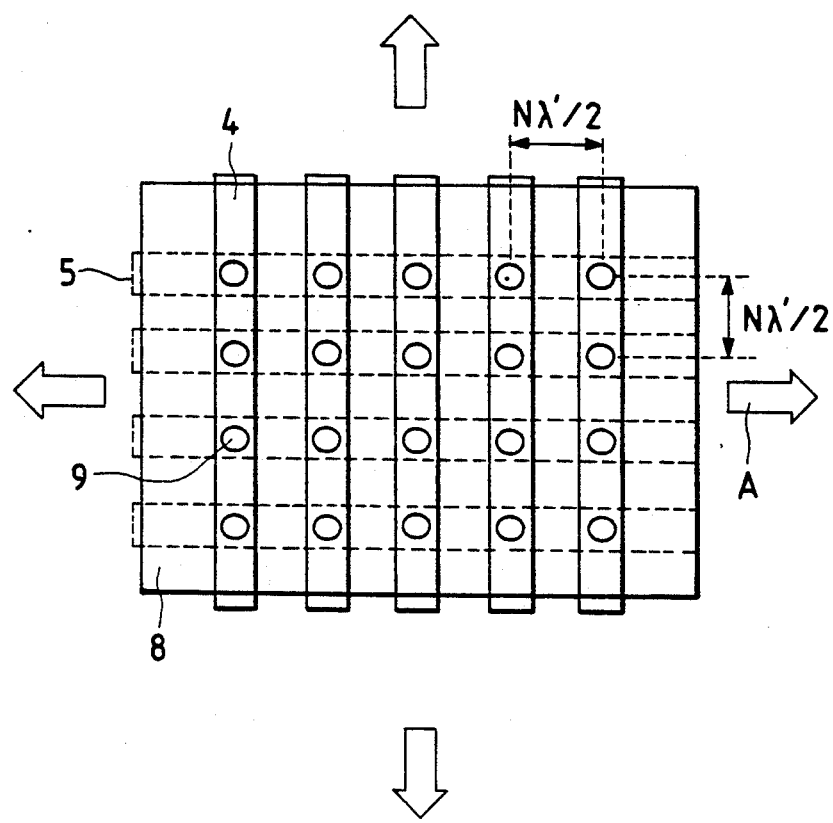

In the embodiments 1 and 2, a plurality of nanowhiskers 9 were arranged on the plane of a GaAs (111) B semi-insulating substrate 8 so that the distance between adjoining nanowhiskers 9 would become an integer times as large as $\lambda/n_2$ as shown in FIG. 10. Then, n-electrodes 5 were formed on the substrate 8 in an array of rows or columns as shown in FIG. 5a and FIG. 12. The electrode material stuck to the nanowhisker 9 was easily removed by etching the same as in the embodiment 4. Then, SOG 6 was applied and baked and, then, p-electrodes 4 were formed in the same way as in the embodiment 2. Thus, it became possible to cause one of the nanowhiskers to emit light by applying power to the p-electrode 4 connected to the desired nanowhisker 9 of the described arrangement.

It is of course possible to cause a plurality of desired nanowhiskers 9 to emit light.

In the present embodiment, completely the same results were obtained even if the positions of the p-type region and n-type region were reversed.

Embodiment 6

Figure 13:
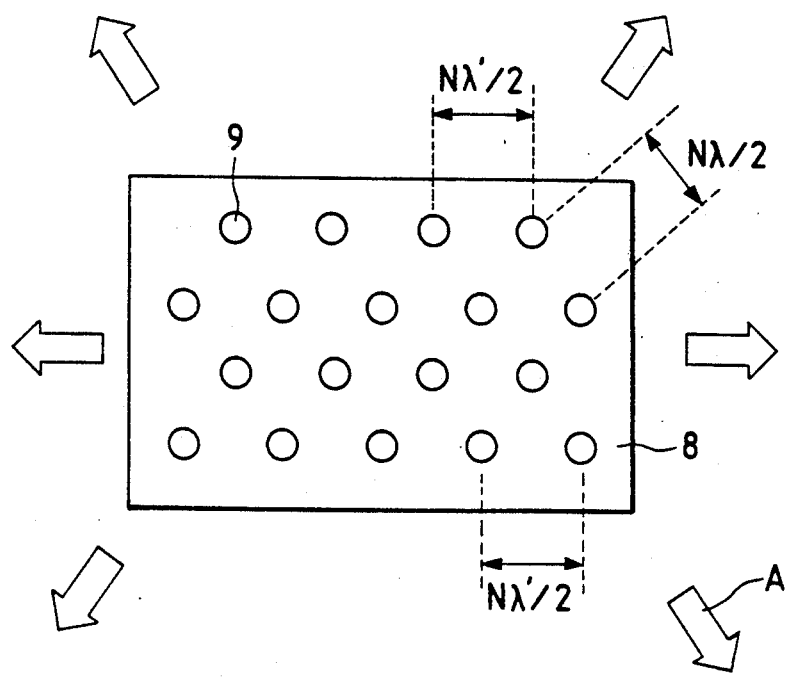
FIGS. 13 and 14 are diagrams explanatory of optical devices emitting light various directions including four directions.

A plurality of nanowhiskers 9 were formed on the plane of a GaAs (111) B semi-insulating substrate 8 so that the distance between adjoining nanowhiskers 9 would become an integer times as large as $\lambda/n_2$ as shown in FIG. 13 and, then, electrodes were formed in the same way as in the embodiment 4. Laser beams were lased only in the directions as indicated by the arrows A in FIG. 13.

In the present embodiment, completely the same results were obtained even if the positions of the p-type region and n-type region were reversed.

Embodiment 7

Figure 14:
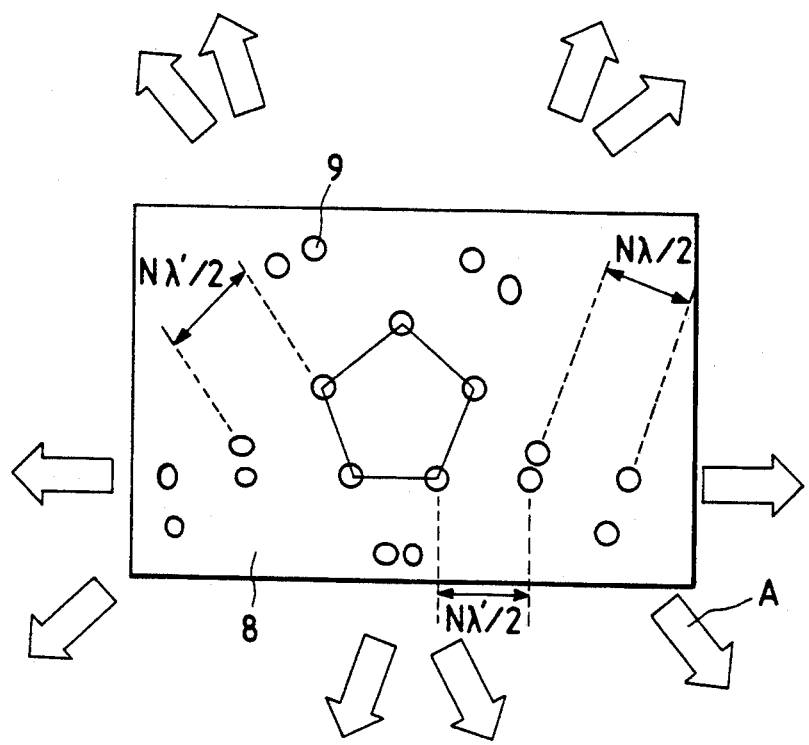
Figure 15:
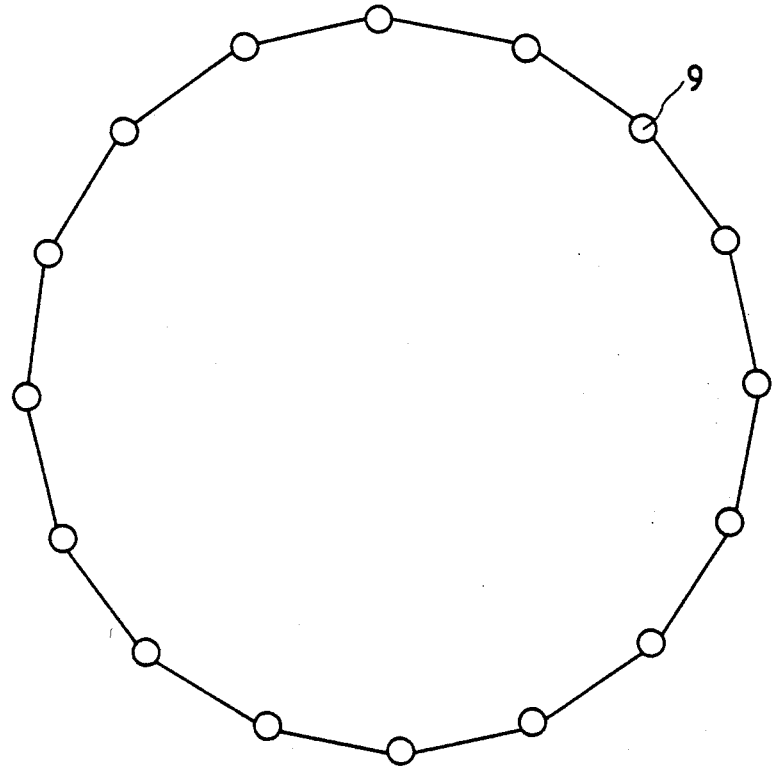
FIG. 15 is a diagram explanatory of an optical device emitting light in n directions.

In the same way as in the embodiment 5, a plurality of nanowhiskers were formed on the plane of a GaAs (111) B semi-insulating substrate 8 so that the distance between adjoining nanowhiskers 9 would become an integer times as large as $\lambda/n_2$ as shown in FIG. 14 and, then, electrodes were formed in the same way as in the embodiment 4. Laser beams were lased only in the directions as indicated by the arrows A in FIG. 14.

In the present embodiment, completely the same results were obtained even if the positions of the p-type region and n-type region were reversed.

Embodiment 8

Figure 9:
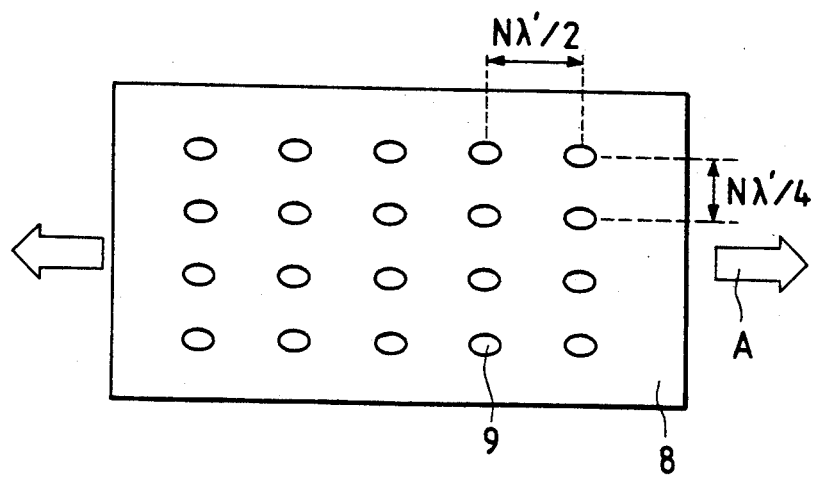
FIG. 9 is a diagram explanatory of an optical device emitting light in one direction.

A plurality of nanowhiskers 9 were formed on the plane of a GaAs (111) B semi-insulating substrate 8 so that the distance between adjoining nanowhiskers 9 in one direction would become an integer times as large as $\lambda/n_2$ and the distance in the other direction would become half the above value as shown in FIG. 9 and, then, electrodes were formed in the same way as in the embodiment 4. Laser beams were lased only in the directions as indicated by the arrows A in FIG. 9.

In the present embodiment, completely the same results were obtained even if the positions of the p-type region and n-type region were reversed.

Embodiment 9

Figure 16A:
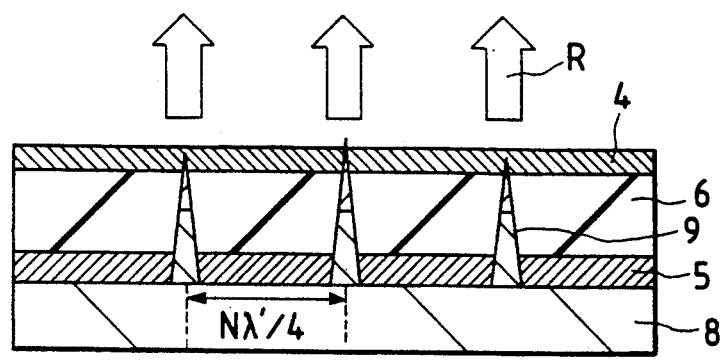
FIGS. 16a, 16b, and 16c are diagrams explanatory of uses as an optical device emitting light in the longitudinal direction of the nanowhisker, an optical amplifier, and a light direction changer, respectively.

An optical device was produced through the same process as that for the embodiment 5. However, a transparent electrode formed of an $SnO_2$ film was used as the p-electrode 4 on the top surface of the device. The distance L between adjoining nanowhiskers 9 was set to $N\lambda'/2$. In the present embodiment, laser beams in the horizontal directions were not observed but a laser beam R was observed, instead, in the vertical direction as shown in FIG. 16a. The laser beam R was that having good coherence with an expanse comparable to the area of the electrode of the device, approximately $2.3 \times 10^4$ ($\mu m^2$).

In the present embodiment, completely the same results were obtained even if the positions of the p-type region and n-type region were reversed.

Embodiment 10

Figure 16B:
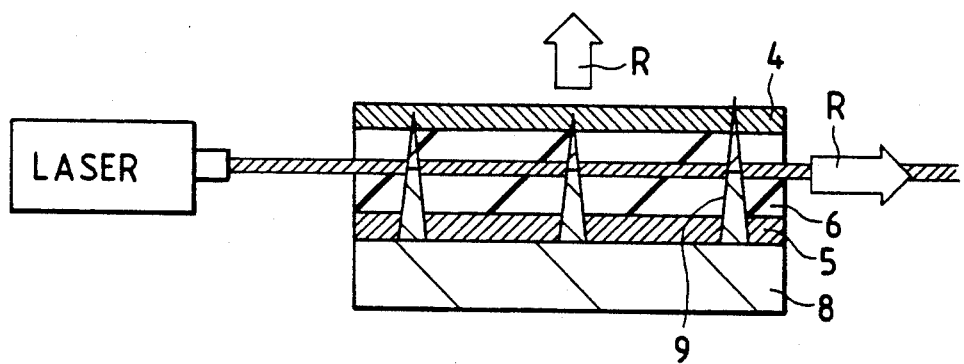

An apparatus as shown in FIG. 16b was structured using the optical device produced by the method shown in the embodiment 2. A high voltage (1.5 V) was applied to this apparatus and a laser beam with a wavelength of around 860 nm lased from another semiconductor laser was transmitted through the apparatus. The laser beam R then emitted was better in coherence than the beam introduced therein. By arranging as described above, the optical device according to the present invention can be used not only as an oscillator but also as a resonator of laser beam.

Further, when, while a high voltage (1.5 V) was applied to the apparatus structured in the embodiment 9, a laser beam from another semiconductor laser was introduced into the apparatus as shown in FIG. 16b, a beam with extremely good coherence was emitted deflected in the vertical direction.

In the present embodiment, completely the same results were obtained even if the polarities p and n were reversed.

Embodiment 11

Structuring the apparatus shown in FIG. 16b in the same way as described in the embodiment 10, an electric measuring instrument was connected to the optical device instead of the voltage source having been connected to the same. Then, it was observed that a voltage of 1.5 V was impressed on the instrument. When the beam from the semiconductor laser was modified to a pulse signal, the optical device could accurately convert the light signal into an electric signal.

Figure 16C:
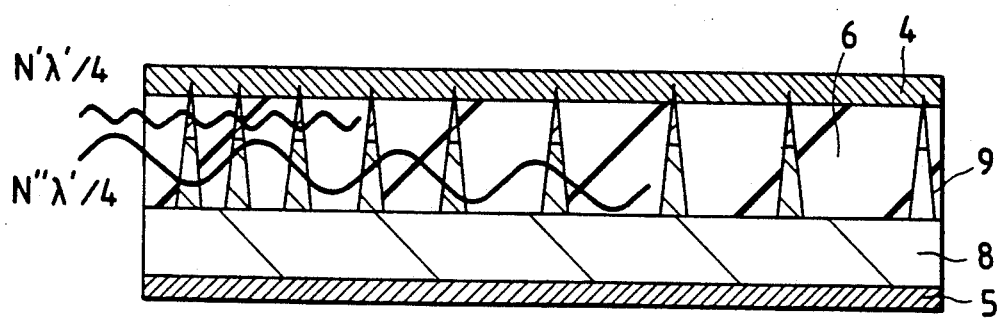

Further, when the distance between adjoining nanowhiskers 9 was changed in various ways as shown in FIG. 16c, the incoming light pulse signal was correctly read by the optical device even if the incoming laser beam was changed variously.

Figure 17:
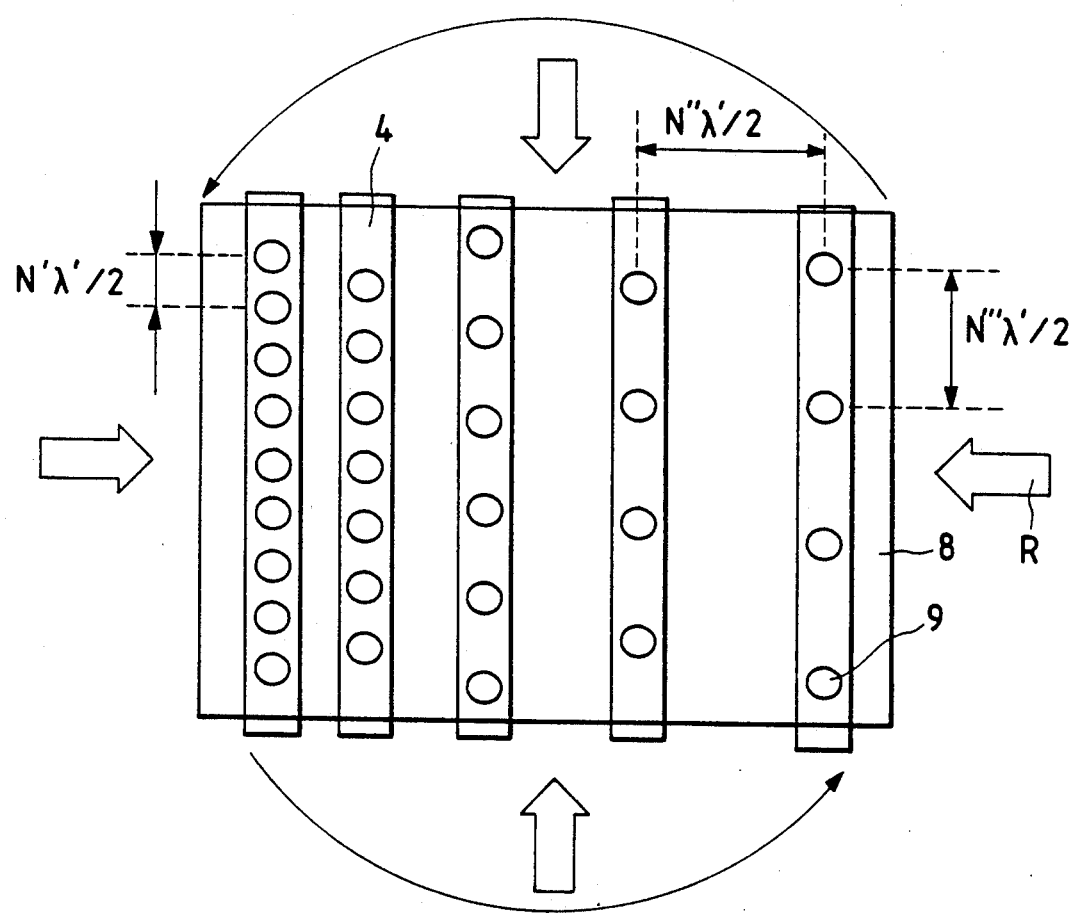
FIG. 17 is a diagram explanatory of a light direction detector according to the present invention.
Figure 18A:
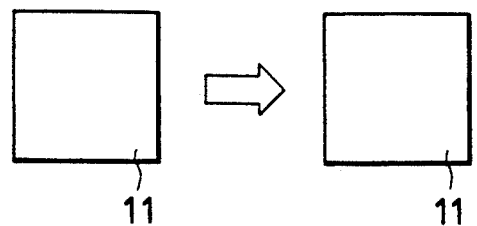
FIGS. 18a and 18b are diagrams explanatory of an optical computer according to the present invention.
Figure 18B:
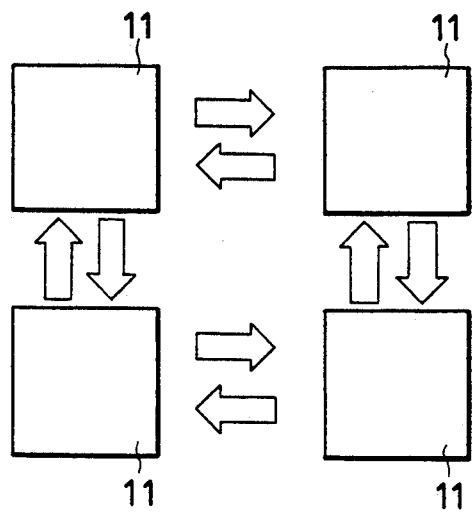

Further, when the distance between the nanowhiskers 9 was changed for each row or column and electrodes 4 were formed as shown in FIG. 17, the optical devices read signals of electromagnetic wave transmitted from the surroundings and indicated the transmitted directions and power of the signals as electric signals.

Even if the positions of the p-type region and n-type region are reversed in the present embodiment, the device is equally usable though only the polarities of the electric characteristics are reversed.

Embodiment 12

Figure 19:
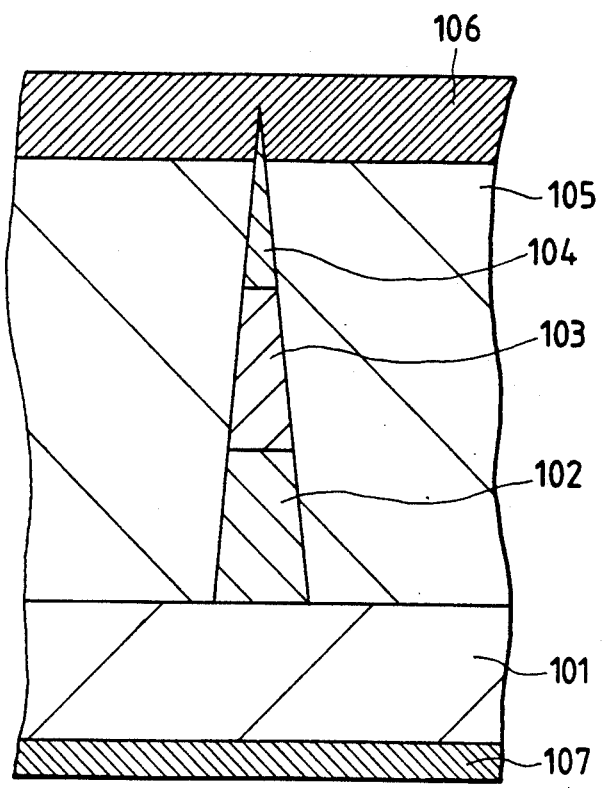
FIG. 19 is a diagram showing sectional structure of a diode including a nanowhisker having a hetero junction.

This embodiment will be described with reference to FIG. 19. GaAs/AlGaAs hereto nanowhiskers were formed by an MOCVD method on an n-type GaAs (111) substrate 101 doped with Si in a density of $10^{19}/cm^3$. First, Ga ions were implanted into specified regions in the substrate 101 by a focused ion beam method. As crystals are allowed to grow, the crystal growth selectively occurs only at the portion where the Ga ions were implanted. This phenomenon was utilized for producing nanowhiskers. The diameter of the Ga ion beam was set to 200Å so that the thickness of the crystal growing above it may become 200Å measured immediately above the substrate. First, an n-type AlGaAs crystal 102 doped with Si in a density of $10^{19}/cm^3$ was grown. Then, an i-type GaAs crystal 103 doped with no impurity was grown. Further, a p-type AlGaAs crystal 104 doped with Zn in a density of $10^{19}/cm^3$ was grown. Al content in the AlGaAs crystal was 0.1. The crystal growing times were set so that the lengths of the n-type and p-type AlGaAs crystals 102 and 104 both would become 1000Å. The length of the i-type GaAs crystal 103 was set to 300 Å.

Then, for stabilization of the surface of the nanowhisker, an AlGaAs layer of which Al content was 0.2 was grown as a cap layer 105 to a thickness of 2000 Å. Since the Al content of the cap layer 105 is higher than that of the nanowhisker portion, the current injected into the nanowhisker does not flow into the cap layer 105. As the cap layer 105, not only the AlGaAs layer but also a transparent insulating member such as an $SiO_2$ film or an SOG resin with a thickness of 2000 Å can be used. At this time, before depositing the cap layer 105, the surface of the nanowhisker was dipped in a water solution of $NH_4S_2$, $Li_2S$ for 20 to 30 hours and, then, heated at a temperature of 50° C. Thereafter, the substrate was heated in hydrogen gas at a temperature of 390° C. for 30 minutes. By this treatment, an oxide film on the surface of the nanowhisker is reduced and a good surface in which non-radiative electron-hole recombination is reduced can be obtained.

The electrode for current injection was formed as follows. Au was deposited by evaporation on the rear surface of the substrate 101 to a thickness of 1000 Å to thereby form a grounding electrode 107. Au/Zn alloy was deposited by evaporation on the surface of the cap layer 105 to a thickness of 1000 Å and, thereby, the electrode for current injection 106 was formed. A forward voltage is applied to the pn junction within the nanowhisker through the electrode 106 and, thereby, the current injection can be achieved.

In the present embodiment, a method for producing a nanowhisker having a pin junction in a hereto structure was described. It is possible to have an array of nanowhiskers well suited for use as a laser by controlling positions where focused ion beams are implanted, which will be described later in another embodiment. The nanowhisker having the hereto pin junction produced in the present embodiment can provide higher light-emitting efficiency than other nanowhiskers and the threshold current density can be reduced when a laser is formed of the same. Although an n-type substrate was used in the present embodiment described above, a hetero pin junction can be formed by a similar method even if a p-type substrate is used. As the method for selectively growing nanowhiskers, not only the method using the focused ion beam method but also the method using a mask pattern formed of an insulating film can be used. That is, first, an $SiO_2$ film is formed on a substrate by the known sputtering method to a thickness of 500 Å and, then, a resist is applied onto the same and holes whose diameter is 200 Å are made therein by electron beam exposure, and then, nanowhiskers are grown at the hollowed portions. Thus, the positions where nanowhiskers grow can be specified.

In the present embodiment, an example in which device was structured using GaAs and AlGaAs was shown. Similar device can also be produced by using, as the substrate and the p-i-n portion, GaAs and GaAs-InAs-GaAs, or InP and InP-InGaAsP-InP, respectively.

Embodiment 13

Figure 20:
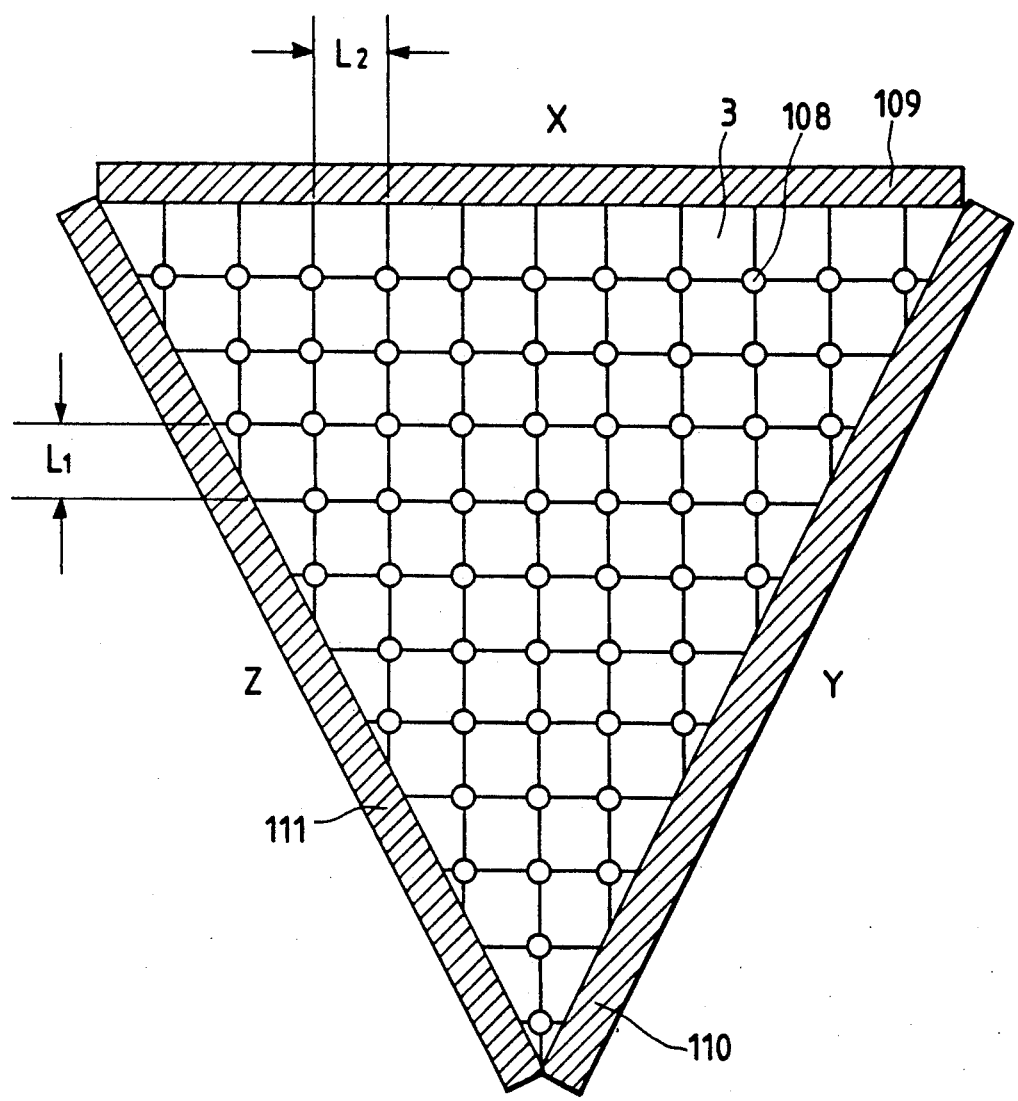
FIG. 20 is a diagram explanatory of a structure of a laser having a plurality of nanowhiskers arranged on a regular-triangular substrate.

An array of nanowhiskers formed by the method described in the embodiment 12 for structuring a laser will now be described. Since the (111) plane is used as the substrate plane, the substrate 3 can be cleaved into regular triangular form as shown in FIG. 20. The cleavage surfaces corresponding to the sides of the regular triangle will be denoted by X, Y, and Z. The array of the nanowhiskers 108 and treatment of the cleavage surfaces depend on the manner how the laser beam is taken out. The array of the nanowhiskers 108 is decided by setting the positions, where the focused ion beams mentioned in the embodiment 12 are implanted, as shown in FIG. 20. When a laser beam is taken out from one surface in the direction perpendicular to the surface, assuming the surface to be X, it may be well to set L1 to an integer multiple of the oscillation wavelength and L2 to another value than that. At this time, nonreflective coatings 109, 110, and 111 are applied to the surfaces X, Y, and Z. Further, when the ratio L1:L2 is set to $1:\sqrt{3}$ and $\sqrt{L1^2+L2^2}$ are set to integer multiples of the oscillation wavelength, two laser beams perpendicular to the surface Y and the surface Z can be taken out. In the above, L1 denotes the distance between adjoining columns of the nanowhiskers parallel to the surface X and L2 denotes the distance between adjoining columns of the nanowhiskers perpendicular to the surface X.

Embodiment 14

Figure 21:
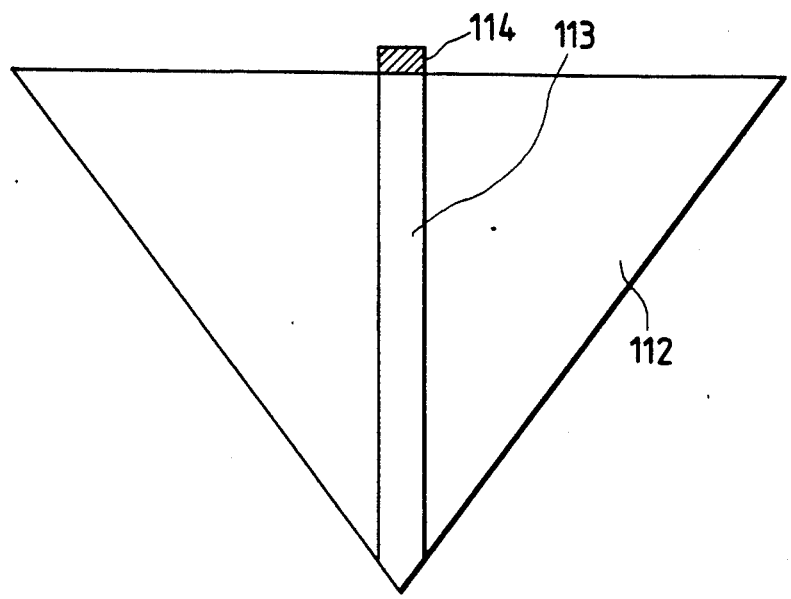
FIG. 21 is a diagram showing a structure of a waveguide type laser of the present invention.

An example of waveguide type laser using a nanowhisker is shown in this embodiment. Nanowhiskers are formed by the method shown in the embodiments 12 and 13. However, the cleaving of the substrate is not yet done at this stage. A resist is applied onto a current injection electrode 106 described in the embodiment 12, the substrate is heated and an optical waveguide pattern of a transmission line form is formed by contact mask exposure, and chemical etching is performed using the pattern and, thereby, an optical waveguide type laser 113 is produced. Then, the substrate is cleaved and a substrate 112 and a laser waveguide 113 as shown in FIG. 21 are obtained. The arrangement of nanowhiskers in the laser waveguide 113 is set to be corresponding to the arrangement given first in the embodiment 13. Finally, the end face of the waveguide is covered by a nonreflective coating film 114.

Embodiment 15

Figure 22:
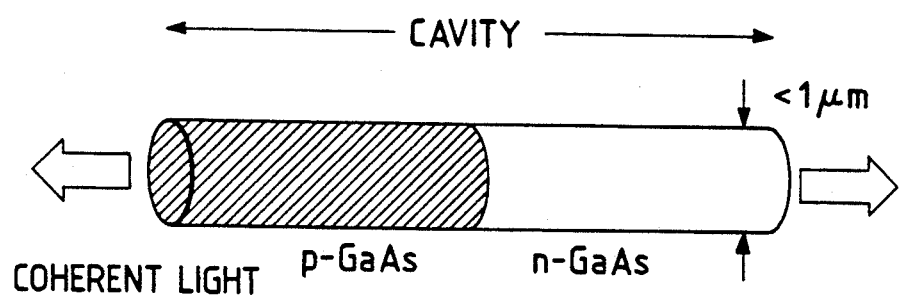
FIG. 22 is a diagram showing an example of a micro-cavity used in the present invention.
Figure 26A:
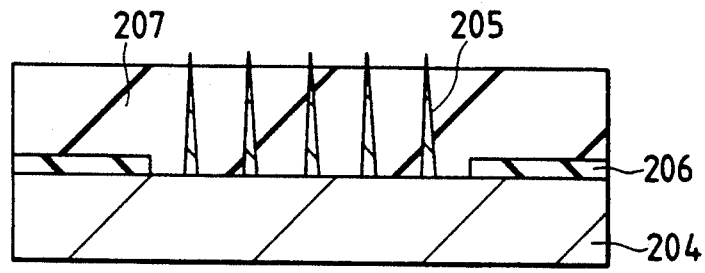
FIGS. 26a, 26b, and 26c are diagrams showing a method manufacturing a micro-cavity laser according to the present invention.
Figure 26B:
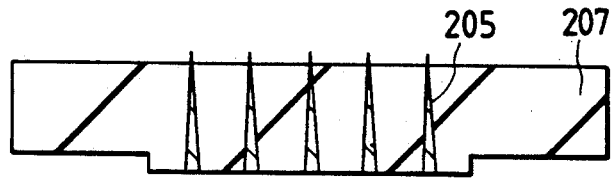
Figure 26C:
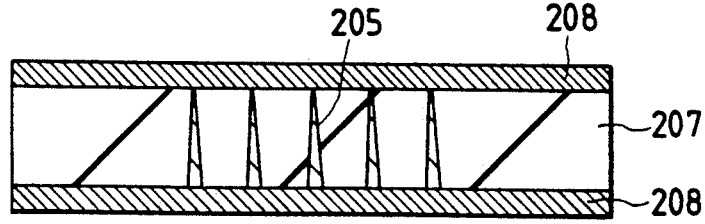

A micro-cavity laser as shown in FIG. 22 was produced. First, ultra microcrystals 205 were grown by selective growth method on a GaAs (111) B semi-insulating substrate 204 as shown in FIG. 26a. More specifically, an $SiO_2$ film 206 being 0.6 $\mu$m thick was formed on the GaAs substrate 204 by a thermal CVD method. Then, a plurality of holes whose diameter is 20 $\mu$m were made in the $SiO_2$ film 206 by the known photolithographic technique. On the substrate 204 having thereon the $SiO_2$. film with the holes, n-doped GaAs microcrystals 205 were grown by a metal organic chemical vapor deposition method (MOCVD method). The form of the crystal can be controlled by the growing conditions. Since the crystal has the property of growing in the (111) direction, when the (111) B substrate 204 is used as in the present embodiment, the crystal grows in the direction perpendicular to the substrate 204 as shown in FIG. 26a. In the present embodiment, the growing conditions were set such that the substrate temperature was 480° C., the ratio between material gases of the V group and IV group (i.e., $AsH_3$ and trimethyl aluminum, respectively) was V/III=20, and the growing time was 20 minutes. The microcrystal grown at this time was approximately 3 $\mu$m long. Then, above the n-GaAs microcrystal, a p-GaAs microcrystal was successively grown under the same conditions as those used for growing the n-GaAs microcrystal. The growing time was similarly set to 20 minutes. As a result, the microcrystal 205 totally 6 $\mu$m long was formed. As dopant, monosilane for doping with Si was used when forming the n-GaAs microcrystal and obtained the n-GaAs microcrystal whose carrier density=$1 \times 10^{18}$/cm$^3$. On the other hand, when forming the p-GaAs microcrystal, biscyclopentadiethylmagnesium was used and the p-GaAs microcrystal whose carrier density=$2 \times 10^{18}$/cm$^3$ was obtained. The grown microcrystals 205 were buried in a resin 207 as shown in FIG. 26a, and then, the microcrystals 205, together with the resin film 207, were taken out from the substrate 209, and then both sides of the resin film 207 were polished by very fine polishing agent so that a form with a thickness of 4 $\mu$m as shown in FIG. 26c was obtained. Then, transparent $SnO_2$ films 208 were formed on both sides and thereby a micro-cavity laser was produced. By passing electric current through the thus obtained micro-cavity laser to allow it to lass, a low-threshold value laser was obtained, of which the threshold current value for lasing is as low as 1 $\mu$A.

Embodiment 16.

Figure 25:
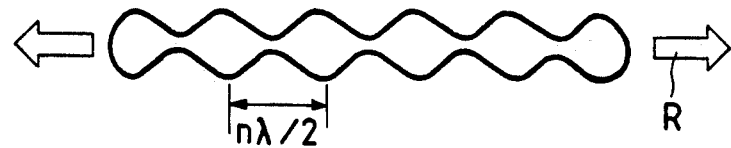
FIG. 25 is a diagram showing a nanowhisker whose diameter varies periodically in the longitudinal direction.

A micro-cavity laser having a structure as shown in FIG. 25 was produced. The method for manufacturing it is the same as that shown in the embodiment 16, but modulation growing was performed in this case in order to periodically vary the diameter in the longitudinal direction. More specifically, the ratio between V group dopant and III group dopant (V/III ratio) during the time of crystal growth was alternately changed between 18 and 22 every five minutes.

The threshold current value for lasing the thus obtained micro-cavity laser was as low as 1 $\mu$A the same as in the embodiment 15, and the laser beam lased by the same, with the half-width being 1 MHz, was very good in coherence.

Embodiment 17

Figure 23:
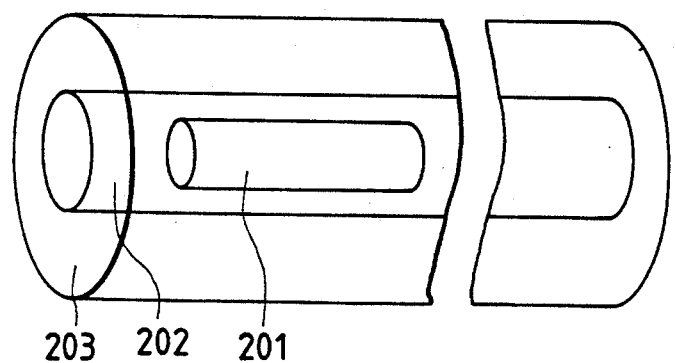
FIG. 23 is a diagram showing a device in which micro-cavity is buried in the core of an optical fiber.
Figure 24:
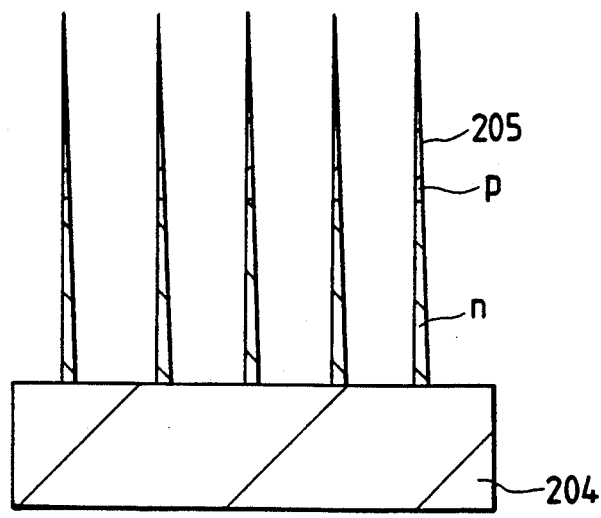
FIG. 24 is a diagram explanatory of ultra microcrystal growth.
Figure 27:
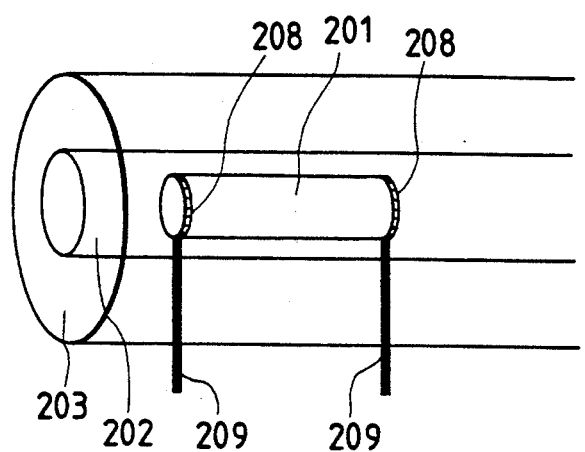
FIG. 27 is a diagram showing a laser formed by burying a micro-cavity in the core of an optical fiber.

An arrangement of a micro-cavity laser 201 buried in the core 202 of an optical fiber 203 as shown in FIG. 23 was produced. By producing micro-cavity lasers by the method shown in the embodiment 14, one of them was taken out and buried into the core 202 of a quartz optical fiber 203. In order to pass current through the micro-cavity laser, minute holes were made in the optical fiber 203 sideways and lead wires 209 were taken out as shown in FIG. 27. In the case of a micro-cavity laser of the described arrangement, its coupling efficiency with the optical fiber was very high as 90%.

Embodiment 18

Figure 28:
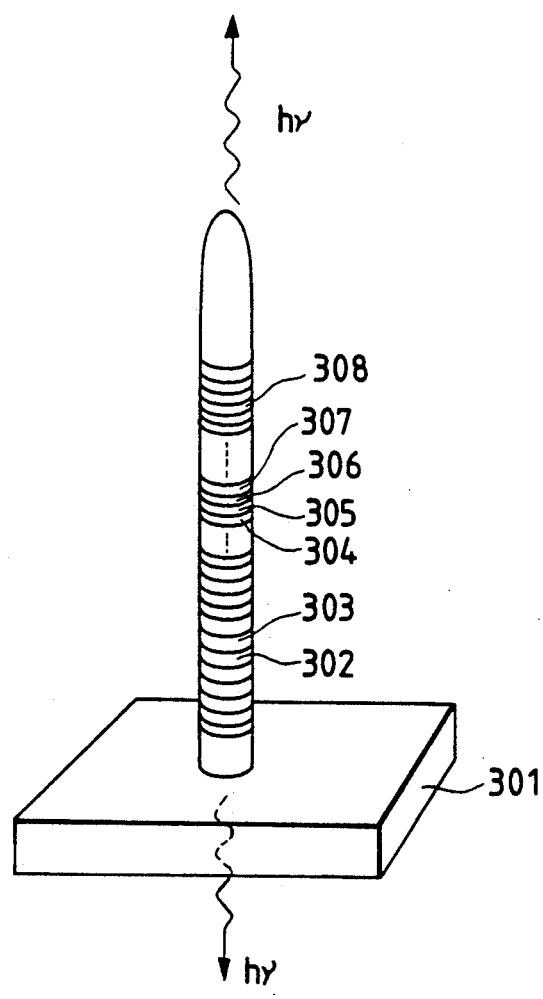
FIG. 28 is a diagram showing a rod type laser of the present invention.
Figure 29:
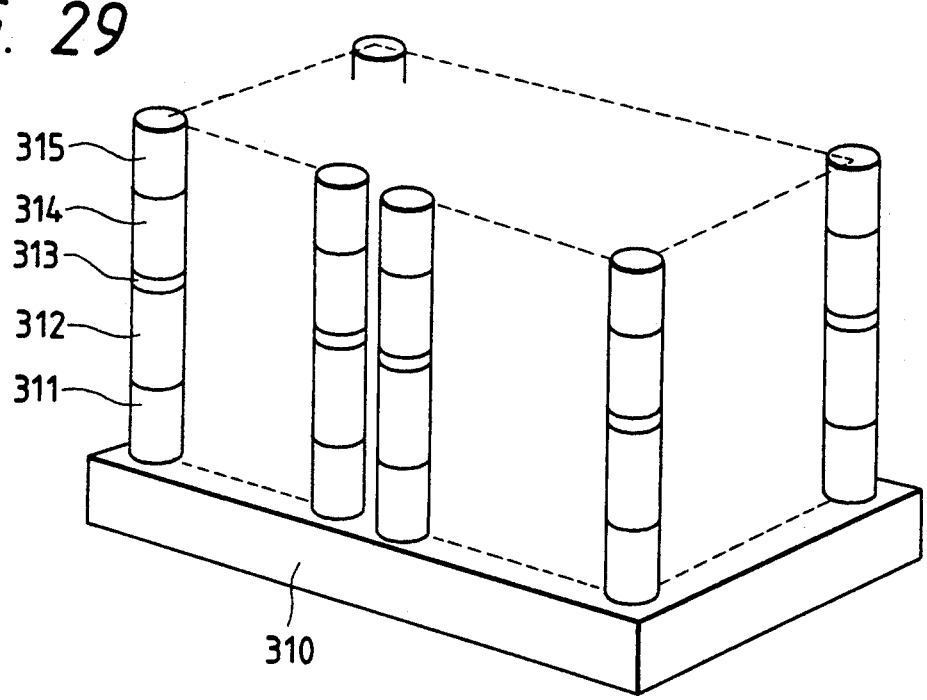
FIG. 29 is a diagram showing a multi-rod type laser of the present invention.

By periodically changing the contents of crystal, a micro-cavity laser similar to the embodiment 16 was produced. As shown in FIG. 28, 50 layers of n-type GaAs 302 and n-type GaAlAs 303 were alternately piled up in the longitudinal direction on a GaAs substrate 301, then, above the same, an n-type $Al_{0.5}Ga_{0.5}As$ layer 304, an $In_{0.2}Ga_{0.8}As$ layer 305 including virtually no impurity, and a p-type $Al_{0.5}Ga_{0.5}As$ layer 306 were piled, and further, above the same, 50 layers of p-type GaAs 308 and p-type GaAlAs 307 were alternately piled up, and thereby a semiconductor rod is formed. At this time, the film thickness of the n-type GaAs 302 and n-type GaAlAs 303 as well as the p-type GaAs 308 and p-type GaAlAs 307 were all set to a quarter of the emission wavelength.

Electrodes (not shown) were provided at the top and bottom of the micro-cavity formed as described above. When current was passed through the electrodes longitudinally in the forward direction of the pn junction, a laser beam having good coherence similarly to that in the embodiment 16 was obtained.

Embodiment 19

N-type GaAlAs was grown 1 $\mu$m in the longitudinal direction, and then, above the same, a GaAs layer including virtually no impurity was grown to a thickness of 2 nm, and, further, above the same, p-type GaAlAs was grown 1 $\mu$m, and, thereby, a plurality of semiconductor rods were formed. These semiconductor rods were arranged in an area of 2 $\mu$m square at a distance virtually equal to the diameter of the rod. Electrodes were provided at the top and bottom of the rods in order to pass current in the longitudinal direction. When a current was passed in the forward direction of the pn junction, a laser beam having very good coherence similarly to that in the embodiment 16 was obtained.

Embodiment 20

Figure 30:
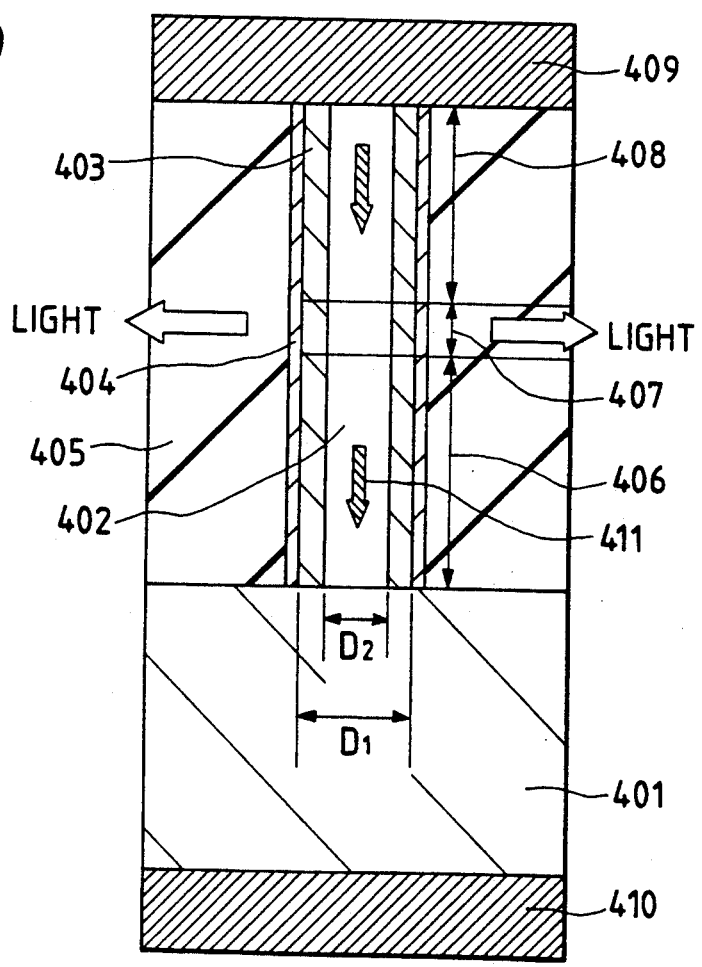
FIG. 30 is a sectional view of a light-emitting device having a nanowhisker of the present invention.

FIG. 30 shows a schematic sectional view of a pn junction light-emitting device whose crystal surface was treated by sulfur (S) or selenium (Se) for its stabilization. In the diagram, reference numeral 401 denotes an n-type InP substrate, and 402 and 403 denote portions where a nanowhisker was formed. Reference numeral 404 denotes the treated layer for surface stabilization formed on the outer surface of the nanowhisker through the above described treatment with S or Se. Reference numeral 406, 407, and 408 denote the n-type region, undoped region and p-type region of the nanowhisker, respectively. Here, the n-type region 406 is 1 μm long, the p-type region 408 is 1 μm long, and the undoped region 407 is 10 nm long. Further, 409 and 410 denote electrodes. When the electrode 409 is supplied with a positive bias and the electrode 410 is supplied with a negative bias, a current flows in the direction indicated by the arrow 411. The thickness of the current transmission line 402 of the nanowhisker is indicated by $D_2$ and the thickness of the nanowhisker including its surface depleion layer 403 is indicated by $D_1$. In the present embodiment, $D_1$ is 20 nm and $D_2$ is 15 nm. When the surface stabilization treatment with S or Se is performed, the thickness of the surface depletion layer 403 is reduced by 20 to 60% due to the existence of the treated layer 404 for surface stabilization. Accordingly, the thickness $D_2$ of the current transmission line 402 of the nanowhisker is increased by 10 to 20% and, hence, it becomes 16 to 18 nm. When a current 411 was passed, light emitted from the portion with the undoped region 407 in the center was observed.

Figure 31:
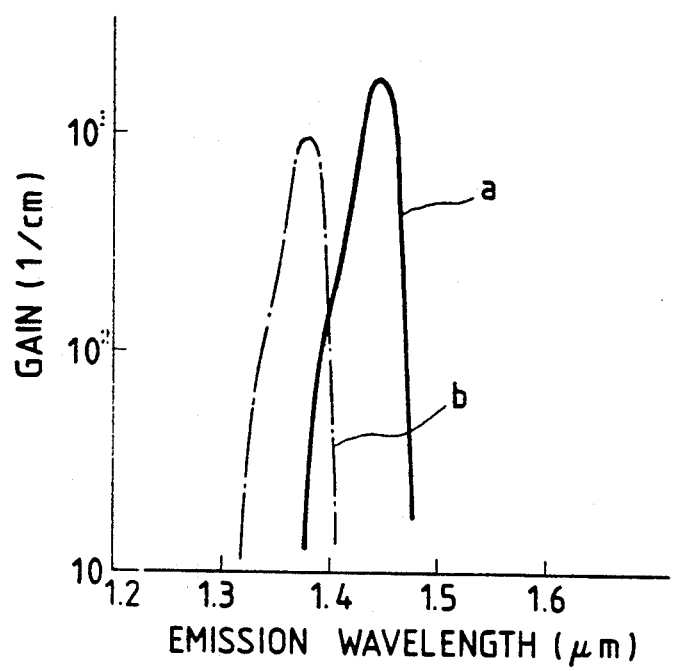
FIGS. 31 and 32 are graphs showing characteristics of light-emitting devices of the present invention.

A graph of relationship between emission gain of the light-emitting device and the emission wavelength is shown in FIG. 31. Referring to FIG. 31, the curves a and b show the case where the surface stabilization treatment of the nanowhisker was performed and the case where the stabilization treatment was not performed, respectively. As apparent from FIG. 32, the working time is extremely prolonged by performing the surface stabilization treatment. Further, as is known from the curve a of FIG. 31, the emission wavelength is shifted to the longer wavelength side by 0.05 μm or so from that of the curve b for the case where the surface stabilization treatment was not performed. The reason why the emission wavelength is shifted to the longer wavelength side when the surface stabilization treatment is performed is because the thickness of the depletion layer on the crystal surface is reduced and the width of the current transmission line where carriers are kept in is increased. On the other hand, the gain increased 1.5 to 2 times. This is because the rate of nonradiative recombination was reduced by the stabilization of the crystal surface.

Figure 32:
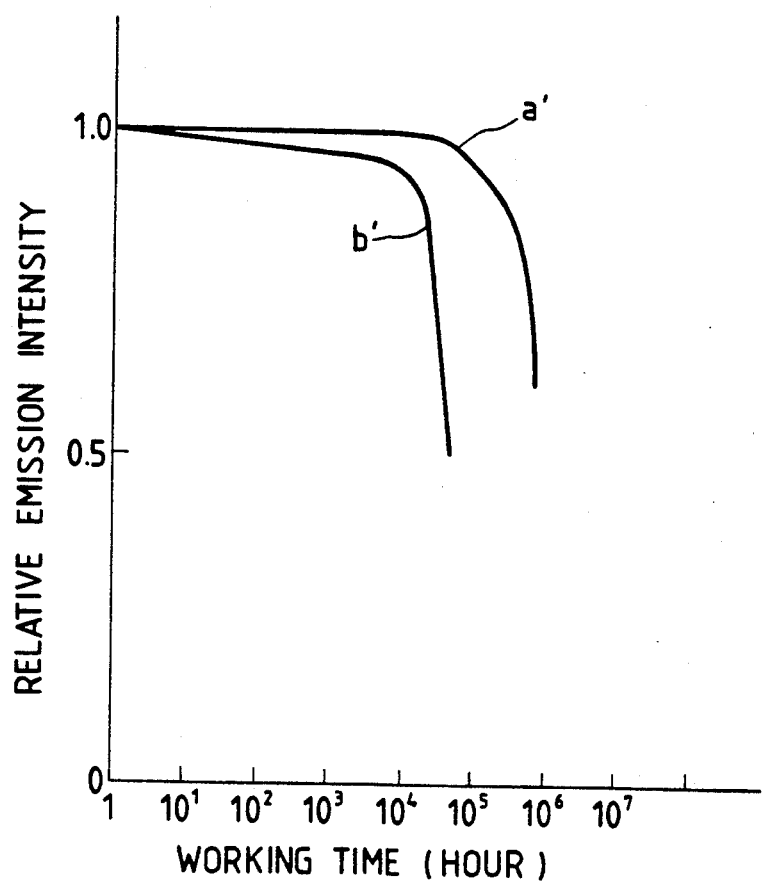

FIG. 32 shows dependence on working time of relative emission intensity in the present embodiment. The graph is the results of investigation of aged change of the peak emission intensity of the light-emitting device. In the case where the surface stabilization treatment was not performed, as apparent from the curve, the peak emission intensity gradually decreased with the working time in the range from $10^3$ hours to $10^4$ hours and it sharply decreased after $10^4$ hours passed. On the other hand, in the case where the surface stabilization treatment was performed, as shown by the curve a, the peak emission intensity showed little change even in the range from $10^4$ to $10^5$ hours. Thus, it was observed that the life span of the light-emitting device was prolonged more than 10 times by the surface stabilization treatment.

According to the present invention as described in the foregoing, a semiconductor laser can be realized by disposing semiconductor rods having a pn junction or a hereto junction at intervals of an integer multiple of the oscillation frequency and an optical antenna can be produced using the same apparatus.

Further, according to the present invention, a microcavity laser whose threshold current is extremely small, as well as a coherent light-emitting device and coherent LED having no threshold value, can be formed, and therefore, key devices very effective for use in the field of optical communications can be obtained. This is because only a limited number of modes can contribute to lasing in the micro-cavity. Further, since the micro-cavity laser according to the present invention can be buried into the core of an optical fiber, it provides such a merit that the coupling efficiency between the optical fiber and the laser is greatly increased. Thus, great industrial advantages can be obtained from the present invention.

What is claimed is:

1. A semiconductor optical device comprising:
a semiconductor substrate;
a plurality of semiconductor nanowhiskers each having a pn junction, formed on a main surface of said semiconductor substrate in the direction substantially perpendicular to said main surface, said plurality of semiconductor nanowhiskers each having a first conductivity type region and a second conductivity type region;
a first electrode electrically connected with said first conductivity type regions of said semiconductor nanowhiskers; and
a second electrode electrically connected with said second conductivity type regions of said semiconductor nanowhiskers;
wherein at least a portion of said plurality of semiconductor nanowhiskers are arranged at substantially equal distances; and
wherein desired semiconductor nanowhiskers can be selectively operated by selectively applying power or potential to the desired semiconductor nanowhiskers, 2. A semiconductor optical device according to claim 1, wherein a portion of said plurality of semiconductor nanowhiskers are arranged at a first distance and the remainder of said semiconductor nanowhiskers are arranged at a second distance which is different from the first distance.

3. A semiconductor optical device according to claim 1, wherein said semiconductor nanowhiskers are single-crystalline nanowhiskers grown on the surface of said semiconductor substrate by epitaxial growth.

4. A semiconductor optical device according to claim 3, wherein diameters of said semiconductor nanowhiskers periodically change according to the position along the length of said semiconductor nanowhiskers.

5. A semiconductor optical device according to claim 1, wherein the distance between said semiconductor nanowhiskers adjoining each other is equal to an integral multiple of one-half of a wavelength of light emitted from said semiconductor nanowhiskers.

6. A semiconductor optical device according to claim 5, wherein the distance between said semiconductor nanowhiskers adjoining each other is substantially different from the wavelength of second light emitted in the direction different from the direction of said light.

7. A semiconductor optical device according to claim 1, wherein an i-type region is sandwiched between the p-type regions and n-type regions of said semiconductor nanowhiskers.

8. A semiconductor optical device according to claim 1, wherein said semiconductor nanowhiskers are formed of the same material as that of said semiconductor substrate.

9. A semiconductor optical device according to claim 8, wherein said material is GaAs.

10. A semiconductor optical device according to claim 1, wherein said semiconductor substrate and said semiconductor nanowhiskers are formed of different materials.

11. A semiconductor optical device according to claim 10, wherein said semiconductor substrate is formed of GaAs and said semiconductor nanowhiskers include GaAlAs.

12. A semiconductor optical device according to claim 11, wherein said semiconductor nanowhiskers further include InGaAs.

13. A semiconductor optical device according to claim 10, wherein said semiconductor substrate is formed of InP and said semiconductor nanowhiskers include InGaAs.

14. A semiconductor optical device according to claim 1, wherein diameters of said semiconductor nanowhiskers on said semiconductor substrate are not larger than 1,000 nm.

15. A semiconductor optical device according to claim 1, wherein the crystalline orientation of said semiconductor nanowhiskers in a longitudinal direction is (111).

16. A semiconductor optical device according to claim 5, wherein said plurality of semiconductor nanowhiskers are arranged one-dimensionally on the surface of said semiconductor substrate.

17. A semiconductor optical device according to claim 5, wherein said plurality of semiconductor nanowhiskers are arranged two-dimensionally on the surface of said semiconductor substrate.

18. A semiconductor optical device according to claim 17, wherein said plurality of semiconductor nanowhiskers are arranged in a regular polygon configuration on the surface of said semiconductor substrate.

19. A semiconductor optical device according to claim 1, wherein said first electrode is formed on a rear surface of said semiconductor substrate.

20. A semiconductor optical device according to claim 1, wherein said first electrode is formed on said main surface of said semiconductor substrate.

21. A semiconductor optical device according to claim 1, wherein said second electrode is connected with upper edge portions of said semiconductor nanowhiskers.

22. A semiconductor optical device according to claim 21, wherein an insulating film is disposed between said semiconductor substrate and said second electrode.

23. A semiconductor optical device according to claim 1, wherein a plurality of line-shaped second electrodes are connected with said second conductivity type regions of desired portions of a plurality of said semiconductor nanowhiskers.

24. A semiconductor optical device according to claim 23, wherein a plurality of line-shaped first electrodes are disposed substantially perpendicular with respect to said first electrode on the main surface of said semiconductor substrate in contact with said first conductivity type regions of desired portions of a plurality of said semiconductor nanowhiskers.

* * * * *

UNITED STATES PATENT AND TRADEMARK OFFICE
CERTIFICATE OF CORRECTION

PATENT NO. : 5,332,910
DATED : July 26, 1994
INVENTOR(S) : Keiichi Haraguchi, et al It is certified that error appears in the above-indentified patent and that said Letters Patent is hereby corrected as shown below:

| Column | Line | |
|--------|------|---|
| 9 | 21 | Change "hereto" to --hetero--. |
| 10 | 4 | Change "hereto" to --hetero--. |
| 14 | 1 | Change "hereto" to --hetero--. |

Signed and Sealed this

Twentieth Day of December, 1994

Attest:

BRUCE LEHMAN

Attesting Officer     Commissioner of Patents and Trademarks